United States Patent
Kim et al.

(10) Patent No.: US 11,552,117 B2
(45) Date of Patent: Jan. 10, 2023

(54) IMAGE SENSING DEVICE

(71) Applicant: SK hynix Inc., Icheon-si (KR)

(72) Inventors: Jong Eun Kim, Daejeon (KR); Ho Young Kwak, Cheongju-si (KR); Jong Chae Kim, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 172 days.

(21) Appl. No.: 16/688,270

(22) Filed: Nov. 19, 2019

(65) Prior Publication Data

US 2021/0074753 A1 Mar. 11, 2021

(30) Foreign Application Priority Data

Sep. 6, 2019 (KR) .................. 10-2019-0110727

(51) Int. Cl.
*H01L 27/146* (2006.01)
*G01S 17/894* (2020.01)
*H04N 5/369* (2011.01)

(52) U.S. Cl.
CPC ...... *H01L 27/14627* (2013.01); *G01S 17/894* (2020.01); *H01L 27/1464* (2013.01); *H01L 27/14603* (2013.01); *H04N 5/3696* (2013.01)

(58) Field of Classification Search
CPC ......... H01L 27/14627; H01L 27/14603; H01L 27/1464; G01S 17/894; H04N 5/3696
See application file for complete search history.

(56) References Cited

U.S. PATENT DOCUMENTS

| | | | |
|---|---|---|---|
| 2009/0160965 A1* | 6/2009 | Sorek ................ | G02B 27/1013 348/222.1 |
| 2010/0073540 A1* | 3/2010 | Wells ................ | G02B 3/0037 348/340 |
| 2011/0176022 A1* | 7/2011 | Cho ................ | H01L 27/14636 348/222.1 |
| 2015/0008553 A1* | 1/2015 | Choi ................ | H01L 27/14612 257/432 |
| 2016/0061656 A1* | 3/2016 | Awatsuji ................ | G01J 1/44 250/208.1 |
| 2016/0343753 A1* | 11/2016 | Asatsuma ........ | H01L 27/14623 |
| 2017/0278826 A1* | 9/2017 | Sugizaki ............. | H01L 27/144 |
| 2019/0081098 A1* | 3/2019 | Lenchenkov ........ | H04N 5/378 |
| 2019/0227151 A1* | 7/2019 | Bikumandla ...... | G02B 27/0087 |
| 2021/0029317 A1* | 1/2021 | Ando ................. | H04N 9/0455 |

FOREIGN PATENT DOCUMENTS

| | | |
|---|---|---|
| KR | 10-2015-0090777 | 8/2015 |
| KR | 10-2017-0088259 | 8/2017 |

* cited by examiner

*Primary Examiner* — Thanh Luu
(74) *Attorney, Agent, or Firm* — Perkins Coie LLP

(57) ABSTRACT

An image sensing device is provided to include a pixel array including unit pixel blocks that are arranged in a first direction and a second direction crossing the first direction, each unit pixel block configured to generate pixel signals in response to incident light reflected from a target object. The unit pixel block includes normal first pixel configured to receive a portion of the incident light at a first arrival time and generate a first pixel signal in response to the incident light, and a second pixel configured to receive another portion of the incident light at a second arrival time and generate a second pixel signal in response to the incident light. The second arrival time is later than the first arrival time.

13 Claims, 7 Drawing Sheets

IMAGE SENSING DEVICE

CROSS-REFERENCE TO RELATED APPLICATION

This patent document claims the priority and benefits of Korean patent application No. 10-2019-0110727, filed on Sep. 6, 2019, which is incorporated by reference in its entirety as part of the disclosure of this patent document.

TECHNICAL FIELD

The technology and implementations disclosed in this patent document generally relate to an image sensing device.

BACKGROUND

An image sensor is a semiconductor device for converting an optical image into electrical signals. With the increasing development of computer industries and communication industries, the demand for high-quality and high-performance image sensing devices in, for example, smartphones, digital cameras, game consoles, Internet of Things (IoT), robots, surveillance cameras, medical micro-cameras, etc., has been rapidly increasing.

In order to acquire a three-dimensional (3D) image using the image sensor, color information of the 3D image and the distance (or depth) between a target object and the image sensor are needed.

A method for acquiring information about the distance between the target object and the image sensor may be classified into a passive method and an active method.

The passive method may calculate the distance between the target object and the image sensor using only image information of the target object without emitting light to the target object. The passive method can be applied to a stereo camera.

The active method may be classified into a triangulation method, a Time of Flight (TOF) method, etc. After light has been emitted from a light source (e.g., a laser source) spaced apart from the image sensor by a predetermined distance, the triangulation method may sense light reflected from a target object, and may calculate the distance between the target object and the image sensor using the sensed result. After light has been emitted from the light source to the target object, the TOF method may measure a time duration in which light is reflected from the target object and returns to the image sensor, such that the TOF method may calculate the distance between the target object and the image sensor using the measurement result.

Image sensors may be classified into CCD (Charge Coupled Device)-based image sensors and CMOS (Complementary Metal Oxide Semiconductor)-based image sensors. The CMOS image sensor can be fabricated to have lower power consumption, lower production costs, and smaller size than the CCD image sensor. The CMOS image sensors have been widely used in mobile devices, for example, smartphones, digital cameras, etc.

SUMMARY

The disclosed technology relates to an image sensing device which measures depth information such as a distance from the image sensing device to a target object. Some embodiments of the disclosed technology can provide more accurate measurement of the depth/distance information by delaying an arrival time of incident light at a certain region of a pixel array and increasing a time difference in the arrivals of incident light in the pixel array.

In accordance with an embodiment of the disclosed technology, an image sensing device is provided to include a pixel array including unit pixel blocks that are arranged in a first direction and a second direction crossing the first direction, each unit pixel block configured to generate pixel signals in response to incident light reflected from a target object. The unit pixel block may include a first pixel configured to receive a portion of the incident light at a first arrival time and generate a first pixel signal in response to the incident light, and a second pixel configured to receive another portion of the incident light at a second arrival time and generate a second pixel signal in response to the incident light. The second arrival time is later than the first arrival time.

In accordance with another embodiment of the disclosed technology, an image sensing device is provided to include a semiconductor substrate including a first surface and a second surface facing the first surface, and configured to include a first photoelectric conversion element generating a first pixel signal in response to light incident upon the first surface and a second photoelectric conversion element generating a second pixel signal in response to light incident upon the first surface, and a light delay film disposed over the first surface and configured to reduce a propagation speed of light passing in the light delay film. The light delay film may be disposed over the second photoelectric conversion element and not over the first photoelectric conversion element.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter.

Figure 1:
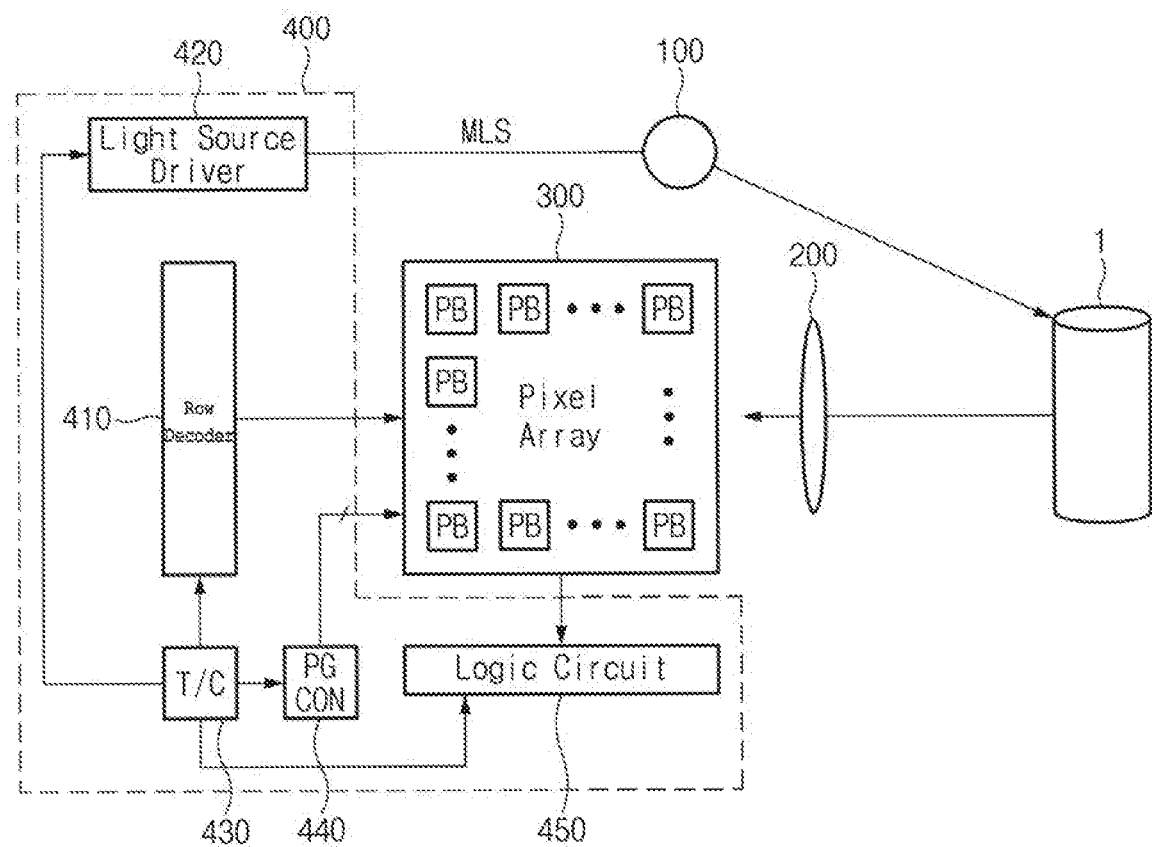
FIG. 1 is an example of a block diagram illustrating an image sensing device based on some implementations of the disclosed technology.

FIG. 1 is an example of a block diagram illustrating an image sensing device based on some implementations of the disclosed technology.

Referring to FIG. 1, the image sensing device may measure a distance to a target object 1 using the Time of Flight (TOF) technique. The image sensing device may include a light source 100, a lens module 200, a pixel array 300, and a control circuit 400.

The light source 100 may emit light to a target object 1 upon receiving a clock signal MLS from the control circuit 400. The light source 100 may be a laser diode (LD) or a light emitting diode (LED) for emitting infrared light or visible light, or may be any one of a Near Infrared Laser (NIR), a point light source, a monochromatic light source combined with a white lamp or a monochromator, and a combination of other laser sources. For example, the light source 100 may emit infrared light having a wavelength of 800 to 1000 nm. Although FIG. 1 shows only one light source 100 for convenience of description, other implementations are possible. For example, a plurality of light sources may also be arranged in the vicinity of the lens module 200.

The lens module 200 may collect light reflected from the target object 200, and may allow the collected light to be focused onto pixels (PXs) of the pixel array 300. The lens module 200 may include a focusing lens having a surface formed of glass or plastic or another cylindrical optical element having a surface formed of glass or plastic. The lens module 200 may include a focusing lens having a convex structure.

The pixel array 300 may include a plurality of unit pixel blocks (PBs) arranged in a two-dimensional (2D) structure in which unit pixel blocks are arranged in a first direction and a second direction crossing the first direction. In some implementations, the second direction can be perpendicular to the first direction. Each unit pixel block (PB) may include plural unit pixels, each of which outputs a pixel signal in response to light that has been reflected from the target object 1 and then received through the lens module 200. In this case, the pixel signals may indicate the distance to the target object 1 from the image sensing device rather a color of the target object 1.

Each unit pixel block (PB) according to the present embodiment may include a normal pixel and a delay pixel that are arranged to be spatially contiguous or adjacent to each other. In some implementations, the light paths of the incident light from the target object to the normal pixel and to the delay pixel are configured to be different from each other. For example, the normal pixel may be a pixel that allows incident light to arrive at its photoelectric conversion element through a light propagation route without any modifications. Thus, the light propagation route from the target object to the normal pixel may be same as in the conventional TOF pixels. Unlike the normal pixel, the light propagation route from the target object to the delay pixel may be modified such that the arrival time of incident light arriving at the photoelectric conversion element in the delay pixel is delayed by a predetermined time. Thus, the arrival times of incident light at the normal pixel and at the delay pixel are different from each other. The normal pixel and the delay pixel will be described in more detail later with reference to the related drawings.

The control circuit 400 may emit light to the target object 1 by controlling the light source 100, may process each pixel signal corresponding to light that was reflected from the target object 1 and then incident upon the pixel array 300 by driving unit pixels (PXs) of the pixel array 300, and may measure the distance (or depth) to the surface of the target object 1.

The control circuit 400 may include a row decoder 410, a light source driver 420, a timing controller 430, a photogate controller 440, and a logic circuit 450.

The row decoder 410 may drive unit pixels (PXs) of the pixel array 300 in response to a timing signal generated from the timing controller 430. For example, the row decoder 410 may generate a control signal capable of selecting at least one of the plurality of row lines. The control signal may include a selection signal for controlling the selection transistor and a transmission (Tx) signal for controlling transfer gates.

The light source driver 420 may generate a clock signal MLS capable of driving the light source 100 in response to a control signal from the timing controller 430. The light source driver 42 may supply either the clock signal MLS or information about the clock signal MLS to the photogate controller 28.

The timing controller 430 may generate a timing signal to control the row decoder 410, the light source driver 420, the photogate controller 440, and the logic circuit 450.

The photogate controller 440 may generate photogate control signals in response to a control signal of the timing controller 430, and may supply the photogate control signals to the pixel array 300. Although FIG. 1 illustrates only the photogate controller 28 for convenience of description, the control circuit 400 may include a photodiode controller that generates a plurality of photodiode control signals in response to a control signal of the timing controller 430 and then transmits the photodiode control signals to the pixel array 300.

The logic circuit 450 may process pixel signals received from the pixel array 300 under control of the timing controller 430, and may thus calculate the distance to the target object 1. For example, the logic circuit 450 may measure time spent in generating the pixel signals since light is emitted from the light source 100. The light emitted from the light source 100 is reflected from the target object 1 and arrives at the photoelectric conversion elements of the unit pixels, and the pixel signals are generated upon the arrival of the light at the photoelectric conversion elements. The logic circuit 450 may calculate the distance to the target object 1 by calculating a time difference between contiguous or adjacent unit pixels.

For the normal pixel, the logic circuit 450 may use a detection time where a pixel signal (normal pixel signal) of the normal pixel is actually detected, as a light arrival time. For the delay pixel, the logic circuit 450 may use the time that is obtained as the subtraction of a detection time where a pixel signal (delay pixel signal) of the delay pixel is actually detected and a predetermined delay time, as a light arrival time. Thus, the pixel array 300 according to the present embodiment has a specific structure capable of intentionally delaying the light arrival time of each of the delay pixels, such that the logic circuit 450 can compensate for the delayed light arrival time during signal processing of the delay pixels.

The logic circuit 450 may include a correlated double sampler (CDS) circuit for performing correlated double sampling (CDS) on the pixel signals generated from the pixel array 300. In addition, the logic circuit 450 may include an analog-to-digital converter (ADC) for converting output signals of the CDS circuit into digital signals.

Figure 2:
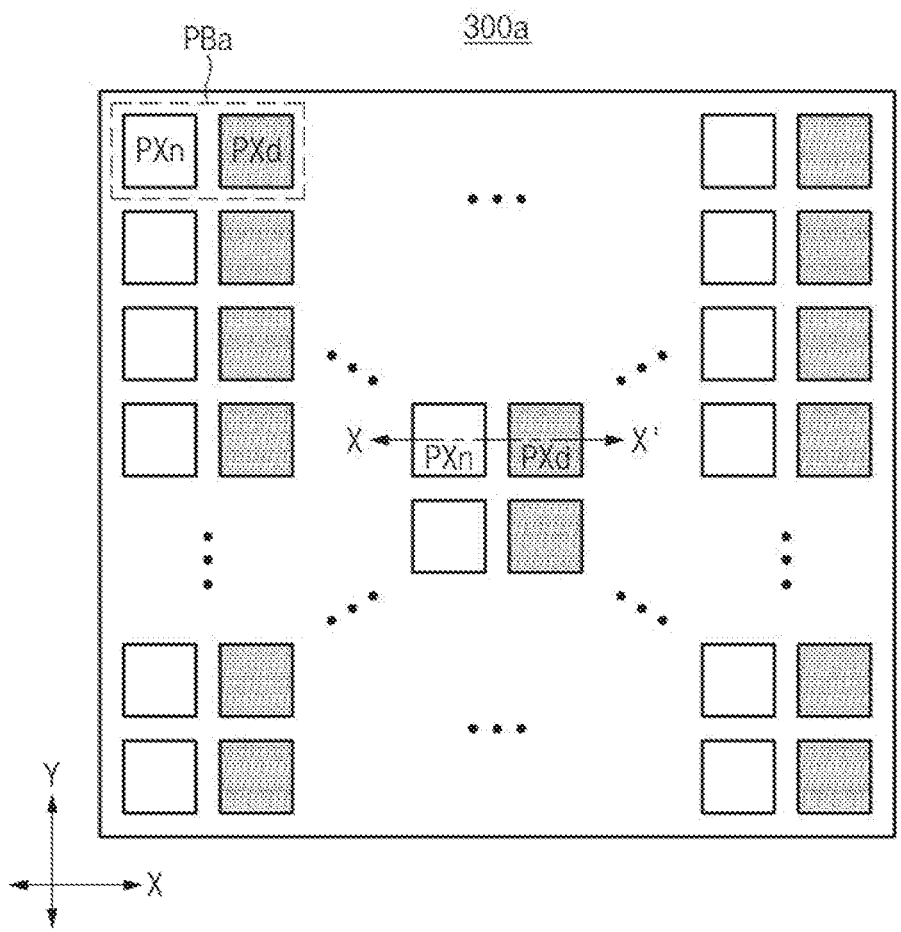
FIG. 2 is an example of a view illustrating a pixel array shown in FIG. 1 based on some implementations of the disclosed technology.

FIG. 2 is an example of a view illustrating a pixel array shown in FIG. 1.

Referring to FIG. 2, the pixel array 300a may include a plurality of unit pixel blocks (PBas) arranged in a first direction (e.g., an X-axis direction) and a second direction (e.g., a Y-axis direction) perpendicular to the first direction. The unit pixel blocks are arranged to each other to be adjacent one another in the first and second directions. Each unit pixel block (PBa) may include a normal pixel (PXn) and a delay pixel (PXd) that are arranged to be spatially contiguous or adjacent to each other in the first direction. For example, each unit pixel block (PBa) may include a (2×1) array structure in which one normal pixel (PXn) and one delay pixel (PXd) are arranged contiguous or adjacent to each other in the first direction.

The normal pixel (PXn) and the delay pixel (PXd) are different from each other in that the light reflected from the target object arrive at the corresponding photoelectric conversion elements of the normal pixel (PXn) and the delay pixel (PXd) at different times from each other. For example, the photoelectric conversion element of the delay pixel (PXd) receives the light reflected from the target object after the photoelectric conversion element of the normal pixel (PXn) receives the light reflected from the target object. For example, when the incident light is reflected from the target object toward the pixel array 300a, light paths to the normal pixel (PXn) and the delay pixel (PXd) are designed to make the arrival time of the incident light at the normal pixel (PXn) and the delay pixel (PXd) different from each other. The normal pixel (PXn) may denote a pixel in which incident light arrives at the photoelectric conversion elements without any modifications. For example, the incident light arrives at the normal pixel (Pxn) through a light propagation route as same as in a conventional TOF sensor. Unlike the normal pixel (PXn), the delay pixel (PXd) may denote a pixel in which light passes with the reduced light propagation speed. For example, the delay pixel (PXd) is disposed together with a light delay film (or structure) for intentionally reducing the light propagation speed. The light delay film can be formed at a light propagation route between the target object and the photoelectric conversion element in the delay pixel (PXd). The image sensing device according to the present embodiment is characterized in that the unit pixel array 300a includes a unit pixel block (PBa) including the normal pixel (PXn) and the delay pixel (PXd).

The pixel array 300a according to the present embodiment may include normal pixels (PXns) each having no light delay film and delay pixels (PXds) each having the light delay film. The normal pixel (PXn) and the delay pixel (PXd) of the unit pixel block (PBa) are arranged in the first direction. In the pixel array including multiple unit pixel blocks, the normal pixels (PXns) and the delay pixels (PXds) are alternately arranged in the first direction, while the same kind of pixels are repeatedly arranged in the second direction.

Figure 3:
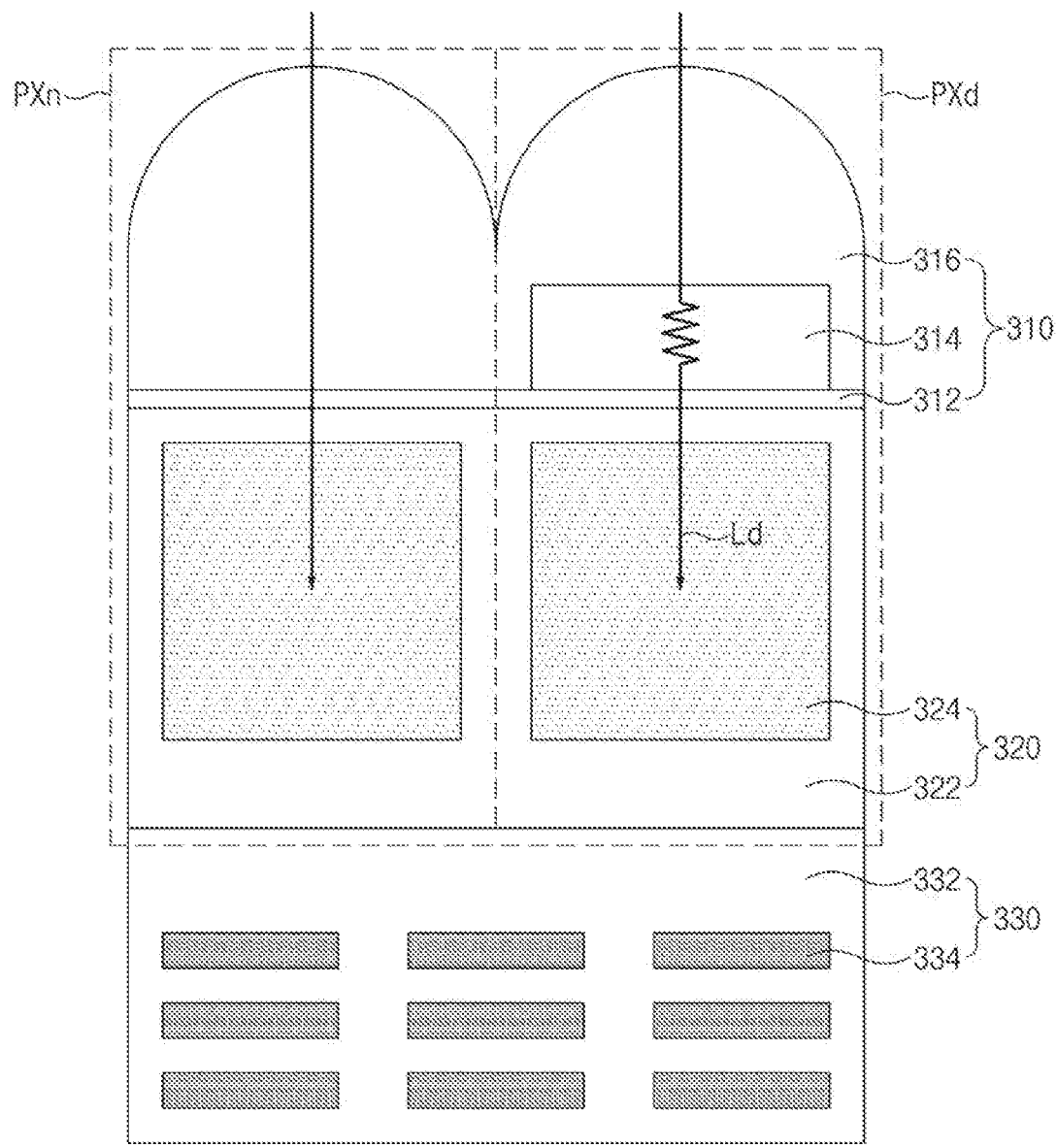
FIG. 3 is an example of a cross-sectional view illustrating a pixel array taken along the line X-X' shown in FIG. 2 based on some implementations of the disclosed technology.

FIG. 3 is an example of a cross-sectional view illustrating the pixel array taken along the line X-X' shown in FIG. 2 based on some implementations of the disclosed technology.

Referring to FIG. 3, the unit pixel block (PBa) may include a light transmission layer 310 and a substrate layer 320.

The light transmission layer 310 may allow light reflected from the target object 1 to be incident upon the photoelectric conversion element 324 contained in a semiconductor substrate 322 through a first surface of the substrate layer 310.

The light transmission layer 310 may include an anti-reflection film 312, a light delay film 314, and a lens layer 316 that are sequentially stacked on the first surface of the semiconductor substrate 322. Although the present implementation is described to include the anti-reflection film 312 and the light delay film 314, the light delay film 314 can be implemented in other configurations.

The anti-reflection film 312 may be formed of or include, for example, silicon oxynitride (SiON), silicon carbide (SiC), silicon carbon nitride (SiCN), or silicon oxycarbide (SiCO). The light delay film 314 may be configured to reduce a propagation speed of light incident upon the delay pixel (PXd), and may thus delay a light arrival time to arrive at the photoelectric conversion element 324 by a predetermined time. The light delay film 314 may not be formed in the normal pixel (PXn) region, and may be formed only in the delay pixel (PXd) region. The light delay film 314 may be included in the lens layer 316.

The optical path length through the light delay film 314 determines the temporal delay of light passing through the film 314 and is be generally proportional to the refractive index of the film 314 and the thickness of the film 314. The light delay film 314 may include at one or more a high-permittivity material film or a high-permeability material film with a high refractive index. For example, a suitable high-permittivity material film may include at least one of aluminum oxide ($Al_2O_3$), hafnium oxide ($HfO_2$), zirconium oxide ($ZrO_2$), hafnium silicate (HfSiO, $HfSiO_4$), zirconium silicon oxide (ZrSiO), yttrium oxide ($Y_2O_3$), tantalum oxide ($Ta_2O_5$), or titanium oxide ($TiO_2$). The high-permeability material film may include a ferromagnetic material.

The propagation speed of light may be inversely proportional to the root of the product of permittivity (c) and permeability (0. Since the light delay film 314 includes at least one of high-permittivity material or high-permeability material, the propagation speed of light becomes slower in the delay pixel (PXd) due to the light delay film 314. Therefore, light (Ld) which is reflected from the target object 1, may arrive at the delay pixel (PXd) with time delay of a predetermined time by the light delay film 314. In some implementations, the delay time of the light (Ld) may be adjusted based on a thickness of the light delay film 314, permittivity or permeability of materials of the light delay film 314. The delay time of the light (Ld) may be calculated in advance based on the properties of the light delay film 314.

The substrate layer 320 may include the semiconductor substrate 322 provided with a first surface and a second surface facing the first surface. The light transmission layer 310 may be formed over the first surface. The semiconductor substrate 322 may include a plurality of photoelectric conversion elements 324. The photoelectric conversion elements 324 contained in the semiconductor substrate 322 may convert an optical signal or incident light to an electrical signal (e.g., pixel signal). The photoelectric conversion elements may include, e.g., a photodiode, a photo transistor, a photo gate, or other photosensitive circuitry capable of converting light into a pixel signal (e.g., a charge, a voltage or a current).

The line layer 330 may be formed over the second surface of the substrate layer 320. The line layer 330 may include an interlayer insulation film 332 and metal lines 334 stacked as a plurality of layers within the interlayer insulation film 332. Each of the metal lines 334 may include at least one of aluminum (Al), copper (Cu), or tungsten (W). The metal lines 334 may include lines for transmitting pixel signals generated in the substrate layer 320 and control signals needed to generate the pixel signals.

Disposing the light delay film 314 in the delay pixel (PXd) only can provide more accurate depth/distance measurement based on the following reasons.

Assume that there is a very small difference in depth between adjacent regions of the surface of the target object 1. Since the depth difference in the adjacent regions of the target object 1 is very small, lights reflected from those adjacent regions of the target object 1 arrive at the photoelectric conversion elements of the pixel array at the almost same time and it is difficult to physically detect such difference in arrival times of light reflected from the adjacent regions of the target object 1. In order to detect this small difference in depth (or distance) between two regions of the target object 1, the photoelectric conversion elements, at which the reflected lights from the target object 1 arrive, need to react immediately and thus generate the pixel signals right after the reception of the reflected lights. However, there are some limitations to provide the photoelectric conversion elements with that high sensitivity to incident light. For example, in order for each photoelectric conversion element to react to incident light with high sensitivity, each photoelectric conversion element needs to have a sufficient size, which makes it difficult to achieve highly-integration density.

Instead of increasing the size of the photoelectric conversion element(s) in the pixel array, the image sensing device according to the present embodiment is designed to increase the difference in the arrival times of the incident lights that are reflected from the different regions of the target object 1. For example, a propagation speed of light to be incident upon the delay pixel (PXd) is reduced and thus the arrival time of the light at the delay pixel (PXd) is delayed as compared to the arrival time of the light at the normal pixel (PXn). With the time delay to arrive at the delay pixel (PXd), the arrival times of the incident light at the normal pixel (PXn) and the delay pixel (PXd) become different sufficiently enough to recognize the depth difference of the target object 1. Thus, it becomes easier to recognize a difference between a first light arrival time of light arriving at the normal pixel (PXn) and a second light arrival time of light arriving at the delay pixel (PXd).

The logic circuit 450 is configured to include the logic circuit 450 to make an adjustment based on the extended difference of the arrival times of the incident light to calculate the final distance from the image sensing device to the target object 1.

For example, the delay time generated by the light delay film 314 can be calculated in advance based on the properties of the light delay film 314. In calculating the final distance to the target object 1, the logic circuit 450 may use a detection time where a normal pixel signal is actually detected, as a light arrival time like the conventional TOF sensors. In association with the delay pixels (PXds), the logic circuit 450 may use a time that is obtained as the subtraction of a detection time where a delay pixel signal is actually detected and a predetermined delay time, as a light arrival time. For the delay pixels (PXds), the light arrival time is the detection time minus the predetermined delay time.

As a result, the image sensing device according to the present embodiment can detect even a small difference in distance without increasing the size of the photoelectric conversion elements.

Figure 4:
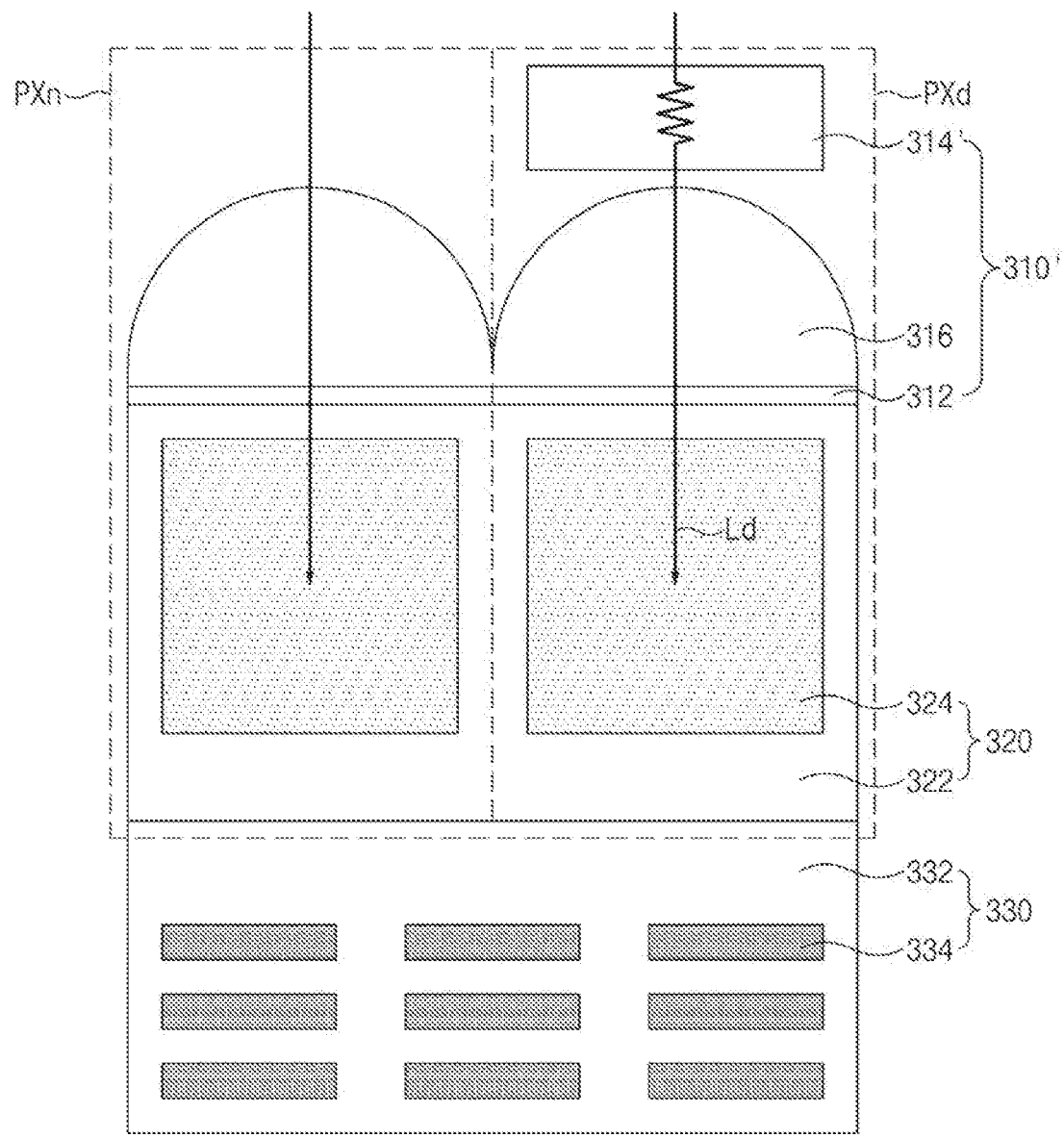
FIG. 4 is an example of a cross-sectional view illustrating a pixel array taken along the line X-X' shown in FIG. 2 based on some implementations of the disclosed technology.

FIG. 4 is an example of a cross-sectional view illustrating the pixel array taken along the line X-X' shown in FIG. 2 based on some implementations of the disclosed technology.

Referring to FIG. 4, the light delay film 314' for use in the light transmission layer 310' may be formed over the lens layer 316.

The light delay film 314' may reduce a propagation speed of light to be incident upon the delay pixel (PXd). Thus, a light arrival time of incident light arriving at the photoelectric conversion element 324 in the delay pixel (PXd) may be delayed by a predetermined time. The light delay film 314' can be formed anywhere in the light propagation route from the target object and to the photoelectric conversion element 324.

Figure 5:
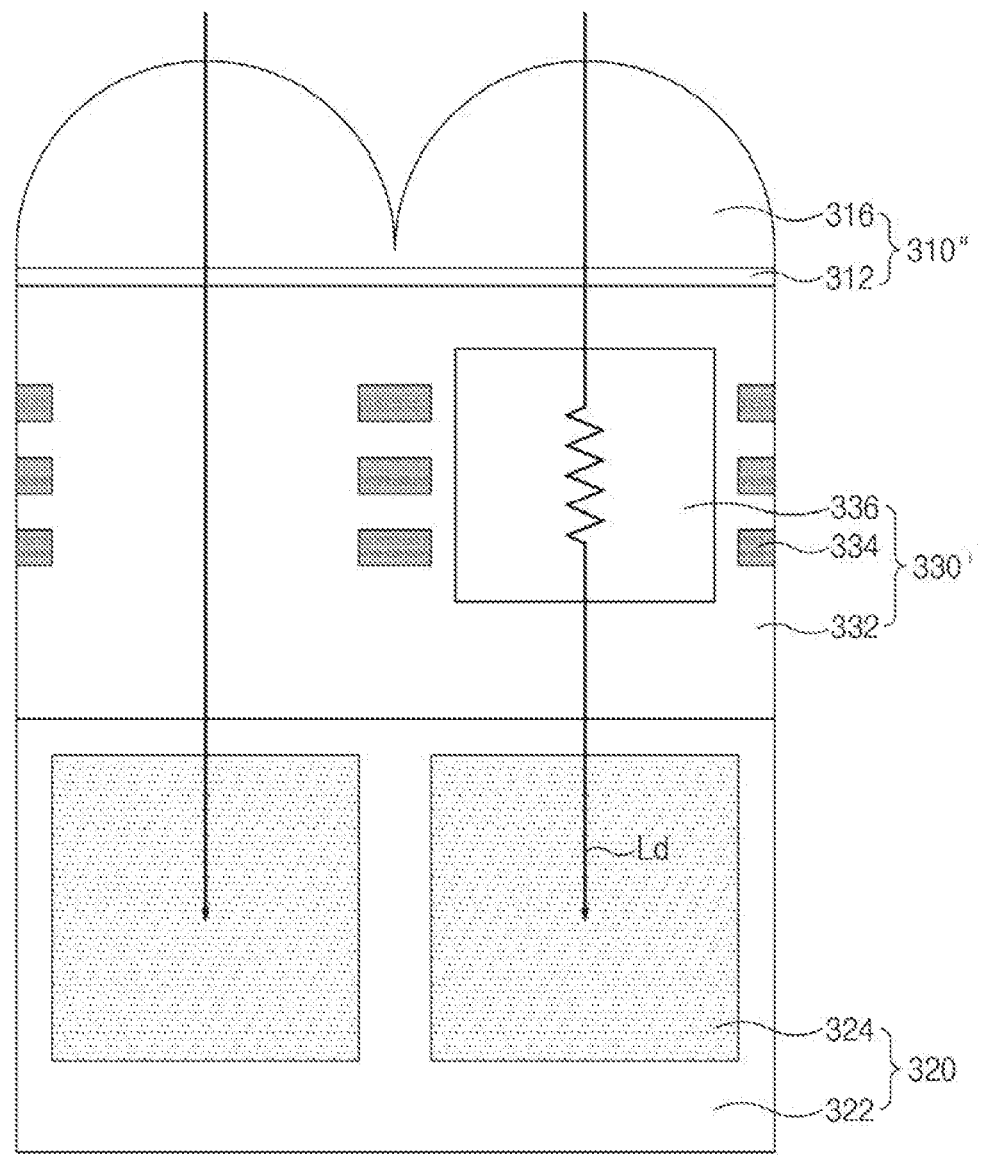
FIG. 5 is an example of a cross-sectional view illustrating a pixel array taken along the line X-X' shown in FIG. 2 based on some implementations of the disclosed technology.

FIG. 5 is an example of a cross-sectional view illustrating the pixel array taken along the line X-X' shown in FIG. 2 based on some implementations of the disclosed technology.

In FIGS. 3 and 4, the light delay film 314 or 314' is applied to a Back Side Illumination (BSI) image sensing device in which the light transmission layer 310 or 310' is formed over a first surface of the substrate layer 320 and the line layer 330 is formed over the second surface facing the first surface of the substrate layer 320.

Referring to FIG. 5, the light delay film 336 is applied to a Front Side Illumination (FSI) image sensing device in which the light transmission layer 310" and the line layer 330' are formed over the first surface of the substrate layer 320.

In this case, the light delay film 336 may be located in the line layer 330' of the delay pixel (PXd) region.

Figure 6:
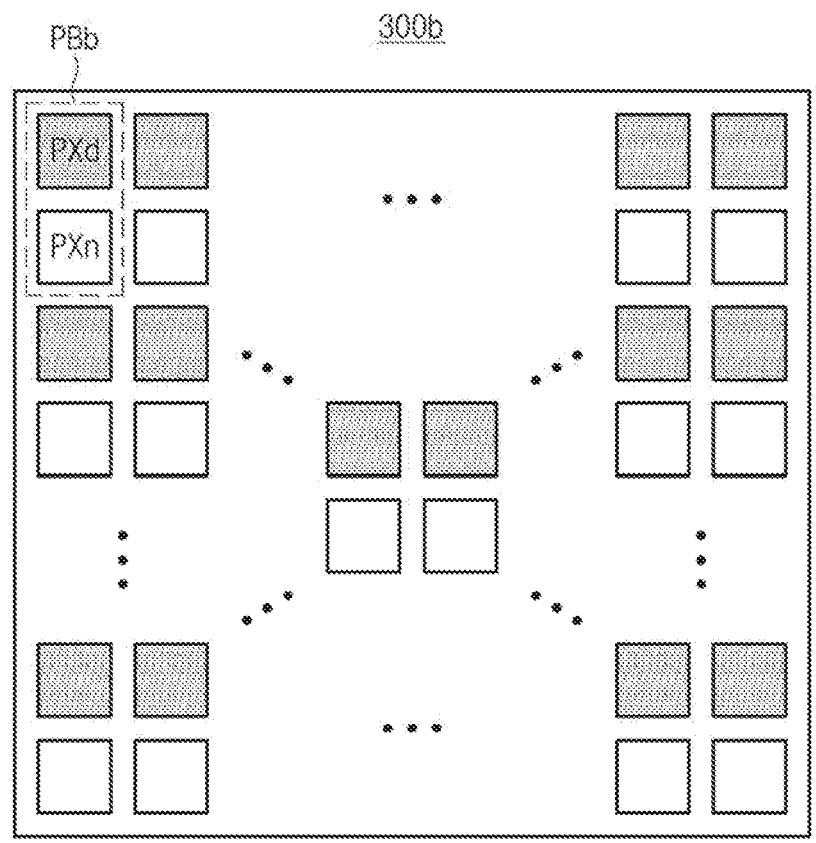
FIG. 6 is an example of a view illustrating the pixel array shown in FIG. 1 based on some implementations of the disclosed technology.

FIG. 6 is an example of a view illustrating the pixel array shown in FIG. 1 based on some implementations of the disclosed technology.

Referring to FIG. 6, the pixel array 300b may include a plurality of unit pixel blocks (PBbs) arranged in the first direction and the second direction. Each unit pixel block (PBb) may include a normal pixel (PXn) and a delay pixel (PXd) that are arranged to be contiguous or adjacent to each other in the second direction. For example, each unit pixel block (PBb) may include a (1×2) array structure in which one normal pixel (PXn) and one delay pixel (PXd) are arranged contiguous or adjacent to each other in the second direction.

The pixel array 300b according to the present embodiment may include normal pixels (PXns) each having no light delay film and delay pixels (PXds) each having the light delay film. The normal pixels (PXns) are arranged in the first direction and the delay pixels (PXds) are arranged in the first direction. In this embodiment, the normal pixels (PXns) and the delay pixels (PXds) may be alternately arranged in the second direction, while the same kind of unit pixels consecutively arranged in the first direction.

The normal pixel (PXn) and the delay pixel (PXd) contained in the unit pixel block (PBb) shown in FIG. 6 may be identical in structure to those of FIGS. 3 to 5.

Figure 7:
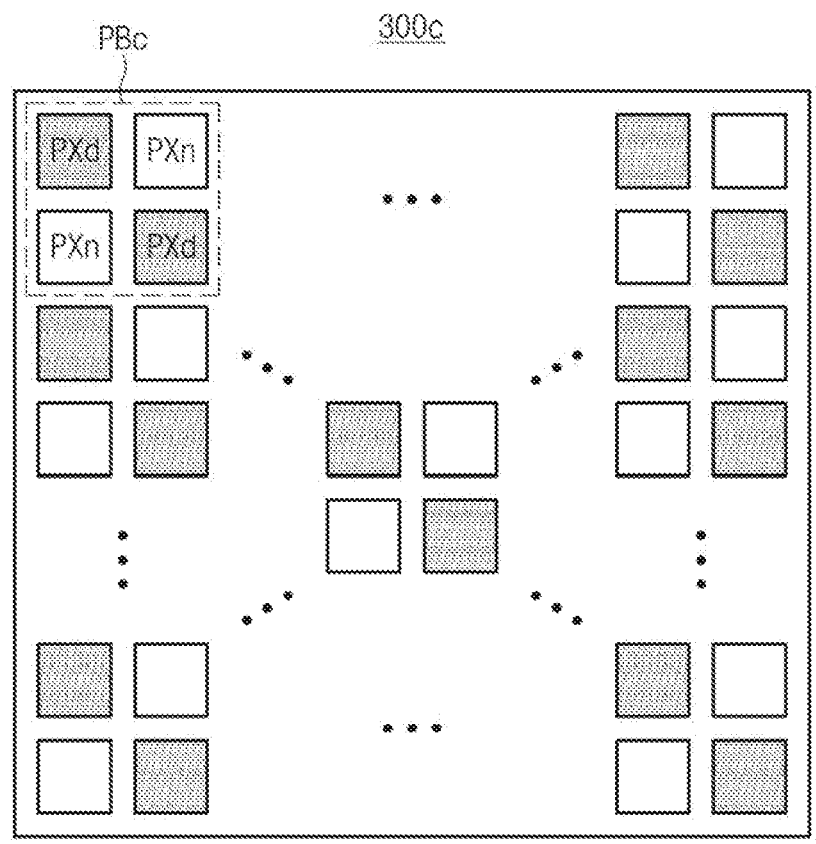
FIG. 7 is an example of a view illustrating the pixel array shown in FIG. 1 based on some implementations of the disclosed technology.

FIG. 7 is an example of a view illustrating the pixel array shown in FIG. 1 based on some implementations of the disclosed technology.

Referring to FIG. 7, the pixel array 300c according to the present embodiment may include a plurality of unit pixel blocks (PBcs) consecutively arranged in the first direction and the second direction. Each unit pixel block (PBc) may include a (2×2) array structure in which two delay pixels (PXds) are arranged in a diagonal direction and two normal pixels (PXns) are arranged in the diagonal direction.

The normal pixel (PXn) and the delay pixel (PXd) contained in the unit pixel block (PBc) shown in FIG. 7 may be identical in structure to those of FIGS. 3 to 5.

As is apparent from the above description, the image sensing device according to the embodiments of the disclosed technology can more correctly measure the distance to the target object.

Those skilled in the art will appreciate that the embodiments may be carried out in other specific ways than those set forth herein without departing from the spirit and essential characteristics of the disclosure. The above embodiments are therefore to be construed in all aspects as illustrative and not restrictive. In addition to variations and modifications in the component parts and/or arrangements, alternative uses will also be apparent to those skilled in the art.

What is claimed is:

1. An image sensing device comprising:
    a pixel array including unit pixel blocks that are arranged in a first direction and a second direction crossing the first direction, each unit pixel block configured to generate pixel signals in response to incident light reflected from a target object,
    wherein each unit pixel block includes:
        a first pixel including a first photoelectric conversion element disposed in a semiconductor substrate and a first lens layer disposed over the first photoelectric conversion element;
        a second pixel including a second photoelectric conversion element disposed in the semiconductor substrate and a second lens layer disposed over the second photoelectric conversion element; and
        a light delay structure embedded in the second lens layer and not in the first lens layer,
        wherein the light delay structure includes a ferromagnetic material.

2. The image sensing device according to claim 1, wherein the light delay structure includes at least one of a high-permittivity material film or a high-permeability material film.

3. The image sensing device according to claim 1, wherein the unit pixel block further includes:
    an insulation material disposed below the semiconductor substrate; and
    a metal line disposed in the insulation material and configured to transmit the pixel signals.

4. The image sensing device according to claim 1, wherein the first pixel and the second pixel are arranged in the first direction.

5. The image sensing device according to claim 1, wherein the first pixel and the second pixel are arranged in the second direction.

6. The image sensing device according to claim 1, wherein the unit pixel block further includes:
    an additional first pixel and an additional second pixels that are arranged in a diagonal direction.

7. The image sensing device according to claim 1, further comprising:
    a logic circuit configured to calculate a distance to the target object based on a first arrival time and a second arrival time,
    wherein the first pixel receives a portion of the incident light at the first arrival time and generate a first pixel signal in response to the incident light, and
    wherein the second pixel receives another portion of the incident light at the second arrival time and generate a second pixel signal in response to the incident light.

8. The image sensing device according to claim 1, wherein the light delay structure includes at least one of aluminum oxide ($Al_2O_3$), hafnium oxide ($HfO_2$), zirconium oxide ($ZrO_2$), hafnium silicate (HfSiO, $HfSiO_4$), zirconium silicon oxide (ZrSiO), yttrium oxide ($Y_2O_3$), tantalum oxide ($Ta_2O_5$), or titanium oxide ($TiO_2$).

9. An image sensing device comprising:
    a pixel array including unit pixel blocks that are arranged in a first direction and a second direction crossing the first direction, each unit pixel block configured to generate pixel signals in response to incident light reflected from a target object,
    wherein each unit pixel block includes:
        a semiconductor substrate having a first surface and a second surface facing the first surface, the incident light being incident upon the first surface;
        a light delay structure disposed in the second pixel and configured to reduce a propagation speed of the incident light passing in the light delay structure;
        a first pixel supported by the semiconductor substrate and configured to receive a portion of the incident light at a first arrival time and generate a first pixel signal in response to the incident light; and
        a second pixel supported by the semiconductor substrate and configured to receive another portion of the incident light at a second arrival time and generate a second pixel signal in response to the incident light, the second arrival time is later than the first arrival time, and
    wherein the light delay structure includes at least one of aluminum oxide ($Al_2O_3$), hafnium oxide ($HfO_2$), zirconium oxide ($ZrO_2$), hafnium silicate (HfSiO, $HfSiO_4$), zirconium silicon oxide (ZrSiO), yttrium oxide ($Y_2O_3$), tantalum oxide ($Ta_2O_5$), or titanium oxide ($TiO_2$)), and
    wherein the light delay structure includes a ferromagnetic material.

10. An image sensing device comprising:
    a semiconductor substrate including a first surface and a second surface facing the first surface, and configured to include a first photoelectric conversion element generating a first pixel signal in response to light incident upon the first surface and a second photoelectric conversion element generating a second pixel signal in response to light incident upon the first surface;
    a lens layer disposed over the first surface; and
    a light delay film disposed in the lens layer and configured to reduce a propagation speed of light passing in the light delay film,
    wherein the lens layer includes a first lens layer disposed over the first photoelectric conversion element and a second lens layer disposed over the second photoelectric conversion element,
    wherein the light delay film is embedded in the second lens layer and not in the first lens layer,
    wherein the light delay structure includes a ferromagnetic material.

11. The image sensing device according to claim 10, wherein the light delay film includes at least one of a high-permittivity material film or a high-permeability material film.

12. The image sensing device according to claim 11, wherein:
    the high-permittivity material film includes at least one of aluminum oxide ($Al_2O_3$), hafnium oxide ($HfO_2$), zirconium oxide ($ZrO_2$), hafnium silicate (HfSiO, HfSiO$_4$), zirconium silicon oxide (ZrSiO), yttrium oxide (Y$_2$O$_3$), tantalum oxide (Ta$_2$O$_5$), or titanium oxide (TiO$_2$), and the high-permeability material film includes a ferromagnetic material.

13. The image sensing device according to claim 10, further comprising:

a line layer disposed below the second surface and including an insulation film in which a metal line transmitting the first pixel signal and the second pixel signal is disposed.

* * * * *